United States Patent
Eun et al.

(10) Patent No.: US 7,723,189 B2
(45) Date of Patent: *May 25, 2010

(54) METHOD FOR MANUFACTURING SEMICONDUCTOR DEVICE HAVING RECESS GATE

(75) Inventors: Yong Seok Eun, Seongnam-si (KR); Su Ho Kim, Icheon-si (KR); An Bae Lee, Seoul (KR); Hai Won Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 357 days.

This patent is subject to a terminal disclaimer.

(21) Appl. No.: 11/618,565

(22) Filed: Dec. 29, 2006

(65) Prior Publication Data

US 2007/0259499 A1 Nov. 8, 2007

(30) Foreign Application Priority Data

May 2, 2006 (KR) .................. 10-2006-0039520

(51) Int. Cl.
*H01L 21/336* (2006.01)

(52) U.S. Cl. .............. 438/270; 438/589; 438/700; 257/E21.621

(58) Field of Classification Search ............ 438/157, 438/176, 192, 195, 259, 267–268, 270–272, 438/283, 396–397, 409, 430, 585–596, 700–703, 438/761–764, 740, 735, 156, 206, 212, 279, 438/FOR. 180, FOR. 363; 257/151–153, 257/249, 314–320, 331, 366, 387, 412, E29.14–E29.161, 257/E29.275, E29.319, E29.201, 396, 397, 257/E21.419, E21.428, E21.429, E21.434, 257/E21.621, E21.629, E21.635, E21.643, 257/328–330, 332, E21.06, E21.238, E21.384, 257/E21.618, E21.655

See application file for complete search history.

(56) References Cited

U.S. PATENT DOCUMENTS 6,436,766 B1 * 8/2002 Rangarajan et al. ......... 438/261

(Continued)

FOREIGN PATENT DOCUMENTS

| KR | 10-2002-0055147 A | 7/2002 |
| KR | 10-2005-0004352 A | 1/2005 |

OTHER PUBLICATIONS

Assignment Data from USPTO Assignee Database for U.S. Appl. No. 11/618,565.*
Assignment Data from USPTO Assignee Database for U.S. Appl. No. 12/259,799.*
Assignment Data from USPTO Assignee Database for U.S. Appl. No. 11/618,565, Jul. 9, 2009.*
Assignment Data from USPTO Assignee Database for U.S. Appl. No. 12/259,799, Jul. 9, 2009.*

*Primary Examiner*—Matthew C Landau
*Assistant Examiner*—Joseph C Nicely
(74) *Attorney, Agent, or Firm*—Townsend and Townsend and Crew LLP (57) ABSTRACT

A method for manufacturing a semiconductor device having recess gates includes forming an etch stop film on a semiconductor substrate; forming an etch stop film pattern selectively exposing the semiconductor substrate by patterning the etch stop film; forming a semiconductor layer on the semiconductor substrate; forming a hard mask film pattern exposing regions, for forming trenches for recess gates, on the semiconductor substrate; removing the semiconductor layer using the hard mask film pattern as a mask until the etch stop film pattern is exposed; forming the trenches for recess gates by removing the etch stop film pattern from the semiconductor substrate; and forming gate stacks, each of which is formed in the corresponding one of the trenches for recess gates.

20 Claims, 6 Drawing Sheets

U.S. PATENT DOCUMENTS

| | | |
|---|---|---|
| 6,617,662 B2 * | 9/2003 | Park .......................... 257/510 |
| 7,125,774 B2 * | 10/2006 | Kim et al. ................... 438/270 |
| 2004/0126973 A1 * | 7/2004 | Lee ............................ 438/262 |
| 2004/0212024 A1 * | 10/2004 | Oh et al. .................... 257/396 |
| 2004/0248368 A1 * | 12/2004 | Natzle et al. ................ 438/300 |
| 2005/0026389 A1 * | 2/2005 | Ciovacco et al. ............ 438/424 |
| 2005/0026420 A1 * | 2/2005 | Han et al. ................... 438/622 |
| 2005/0139910 A1 * | 6/2005 | Koh ........................... 257/330 |
| 2006/0040437 A1 * | 2/2006 | Sandhu et al. .............. 438/186 |
| 2006/0049455 A1 | 3/2006 | Jang et al. |
| 2006/0060936 A1 | 3/2006 | Park et al. |
| 2007/0148980 A1 * | 6/2007 | Cho ........................... 438/700 |
| 2007/0264789 A1 * | 11/2007 | Im .............................. 438/424 |
| 2008/0210900 A1 * | 9/2008 | Wojtczak et al. ........... 252/79.3 |
| 2009/0011565 A1 * | 1/2009 | Murthy et al. .............. 438/303 |
| 2009/0149012 A1 * | 6/2009 | Brask et al. ................. 438/595 |
| 2009/0190394 A1 * | 7/2009 | Mathew et al. .............. 365/174 |

* cited by examiner

METHOD FOR MANUFACTURING SEMICONDUCTOR DEVICE HAVING RECESS GATE

CROSS-REFERENCE TO RELATED APPLICATION

The present application claims priority to Korean patent application No. 10-2006-0039520, filed on May 2, 2006, which is incorporated by reference in its entirety.

BACKGROUND OF THE INVENTION

1. Field of the Invention

The present invention relates to a semiconductor device, and more particularly to a method for manufacturing a semiconductor device having recess gates with uniform trenches.

2. Description of Related Art

As DRAM cells have become highly integrated, design rules for the miniaturization of devices have been developed. Thus, the size of cell transistors and the length of transistor channels have decreased. The decrease in the length of the channels generates a short channel effect, which causes a decrease in the threshold voltage, an increase in the leakage current, and deterioration of refresh characteristics. Accordingly, a semiconductor device having recess gates has been proposed, in which the length of the channel is increased without increasing the footprint of the gate by extending the channel downward into the substrate.

Figure 1:
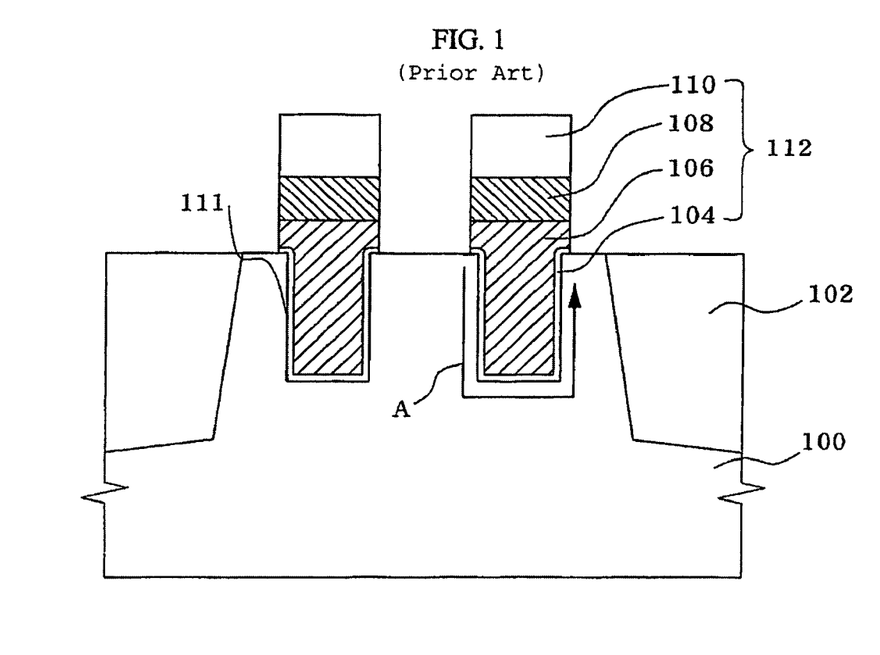
FIG. 1 is a sectional view of a conventional semiconductor device having recess gates.

FIG. 1 is a sectional view of a conventional semiconductor device having recess gates.

With reference to FIG. 1, trenches 111, having a designated depth from the surface of a semiconductor substrate 100, are formed in the semiconductor substrate 100. The active regions in a cell are restricted by an isolation film 102. Then, a gate stack 112 is disposed in each of the trenches 111, and source/drain impurities are implanted into the semiconductor substrate 100, thus forming channels (A). The gate stack 112 includes a gate dielectric film pattern 104, a semiconductor layer pattern 106, a metal film pattern 108, and a hard mask film pattern 110. Compared with a semiconductor device having flat channels, the semiconductor device having the recess gates has channels of a longer length, thus reducing the short channel effect.

When trenches for recess gates are formed by etching the semiconductor substrate 100, the trenches are designed to have a uniform depth, but may have different depths depending on several process conditions. When the depths of the trenches are not uniform, threshold voltages of the cell regions is not uniformly distributed. Thereby, electrical characteristics of the semiconductor device may deteriorate.

SUMMARY OF THE INVENTION

Embodiments of the present invention provide a method for manufacturing a semiconductor device having recess gates, in which trenches for the recess gates have a uniform depth.

In accordance with an embodiment of the present invention, a method for manufacturing a semiconductor device having recess gates includes comprises forming an etch stop film over a semiconductor substrate. An etch stop film pattern is formed by patterning the etch stop film and selectively exposing the semiconductor substrate. A semiconductor layer is formed on the semiconductor substrate. A hard mask film pattern exposing regions is formed on the semiconductor substrate where trenches for recess gates will be formed. The semiconductor layer is removed using the hard mask film pattern as a mask until the etch stop film pattern is exposed. The trenches for recess gates are formed by removing the etch stop film pattern from the semiconductor substrate. Gate stacks are each formed in the corresponding trenches to form recess gates.

DESCRIPTION OF THE PREFERRED EMBODIMENTS

An embodiment of the present invention will be described in detail with reference to the accompanying drawings. In order to clearly express several layers and regions in the drawings, the drawings are enlarged in thickness. The same or similar elements in different drawings are denoted by the same reference numerals even though they are depicted in different drawings.

Figure 2:
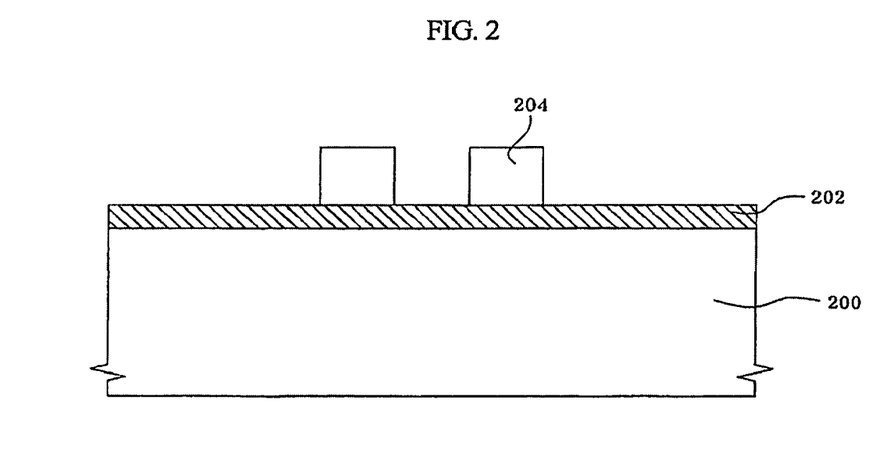
FIGS. 2 to 11 are sectional views illustrating a method for manufacturing a semiconductor device having recess gates in accordance with the present invention.

With reference to FIG. 2, an etch stop film 202, which may include a nitride film, is formed on a semiconductor substrate 200. The etch stop film 202 serves to prevent excessive etching in regions of the semiconductor substrate 200 where trenches for recess gates will be formed. The etch stop film 202 has a thickness (e.g., 30~300 Å) which allows the cleaning process to be performed time in a cleaning solution that includes phosphoric acid ($H_3PO_4$) to be minimized. A photosensitive film pattern 204, which is obtained by applying and patterning a photosensitive film, is formed on the etch stop film 202 such that the etch stop film 202 is selectively exposed.

Figure 3:
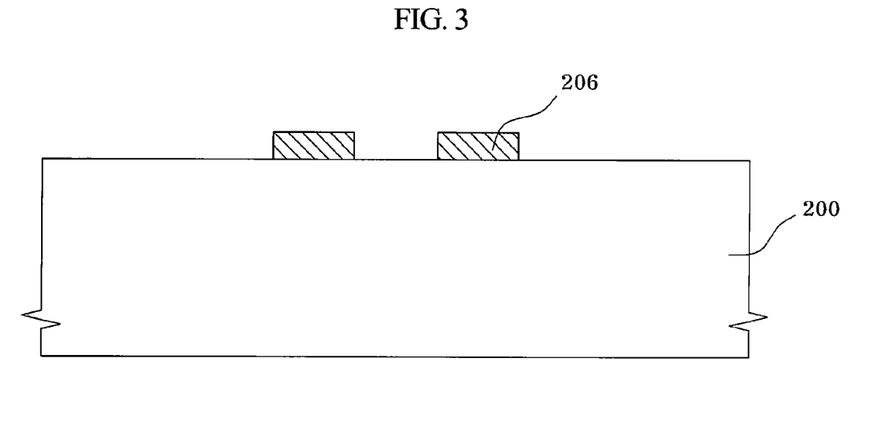

With reference to FIG. 3, an etch stop film pattern 206 is formed by patterning the etch stop film 202 using the photosensitive film pattern 204 as a mask. The etch stop film pattern 206 selectively exposes the surface of the semiconductor substrate 200. The etch stop film pattern 206 is disposed at the positions where trenches for recess gates will be formed.

Figure 4:
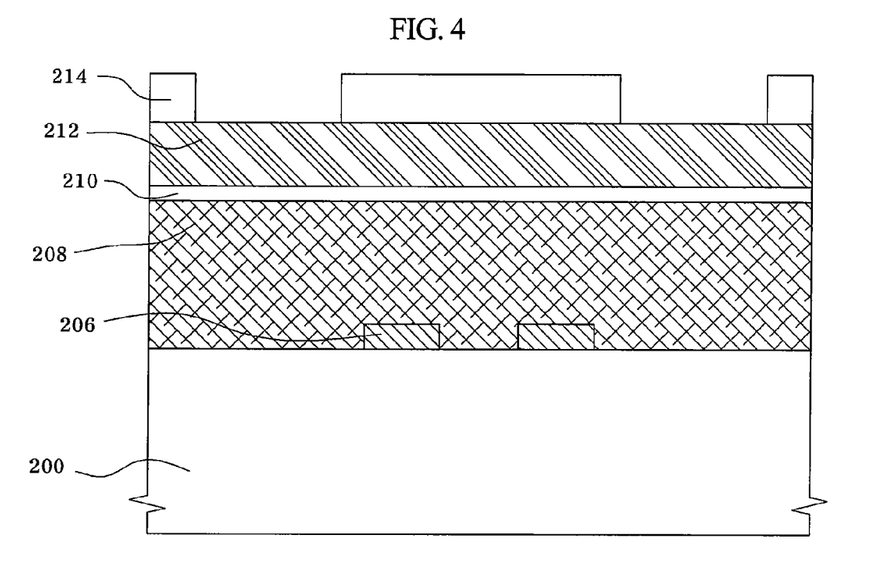

With reference to FIG. 4, a semiconductor layer 208 is formed on the semiconductor substrate 200 and the etch stop film pattern 206. The semiconductor layer 208 includes a polysilicon film or amorphous silicon film, and is formed by chemical vapor deposition (CVD) or epitaxial growth. The semiconductor layer 208 has a thickness of 1,000~1,500 Å and controls the depth of the trenches for recess gates.

A pad oxide film 210 and a pad nitride film 212 are sequentially stacked on the semiconductor layer 208. A photosensitive film is applied to the pad nitride film 212 and patterned, thus forming a photosensitive film pattern 214 which selectively exposes the pad nitride film 212.

Figure 5:
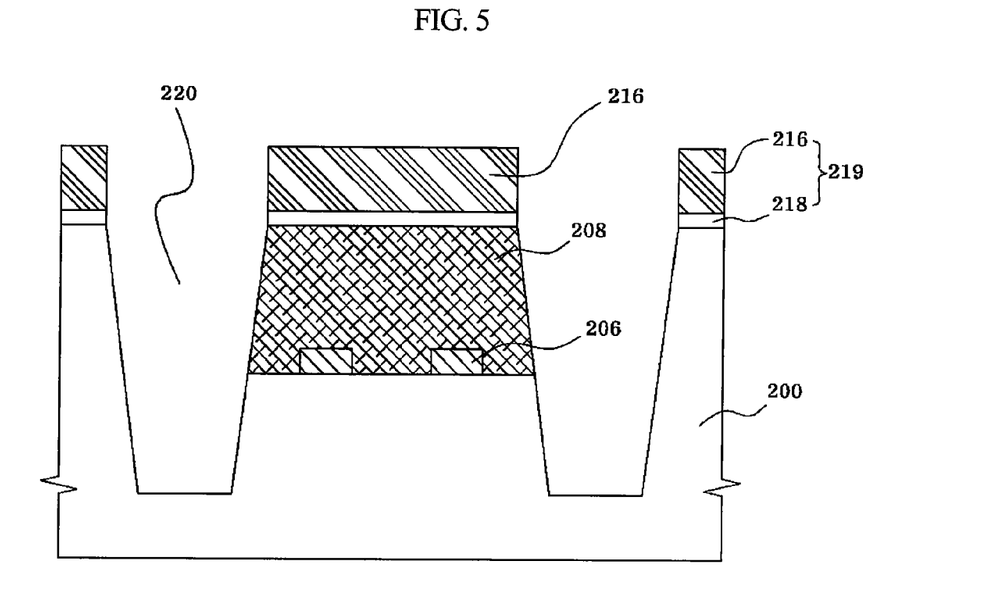

With reference to FIG. 5, using the photo sensitive film pattern 214 as a mask, the pad nitride film 212 and the pad oxide film 210 are etched into the pad nitride film pattern 216 and the pad oxide film pattern 218, respectively. The stacked nitride film pattern 216 and pad oxide film pattern 218 form a mask film pattern 219. Then, the semiconductor substrate 200 is etched to a given depth using the mask film pattern 219, thus forming first trenches 220 used in isolating devices from each other in the semiconductor substrate 200.

Figure 6:
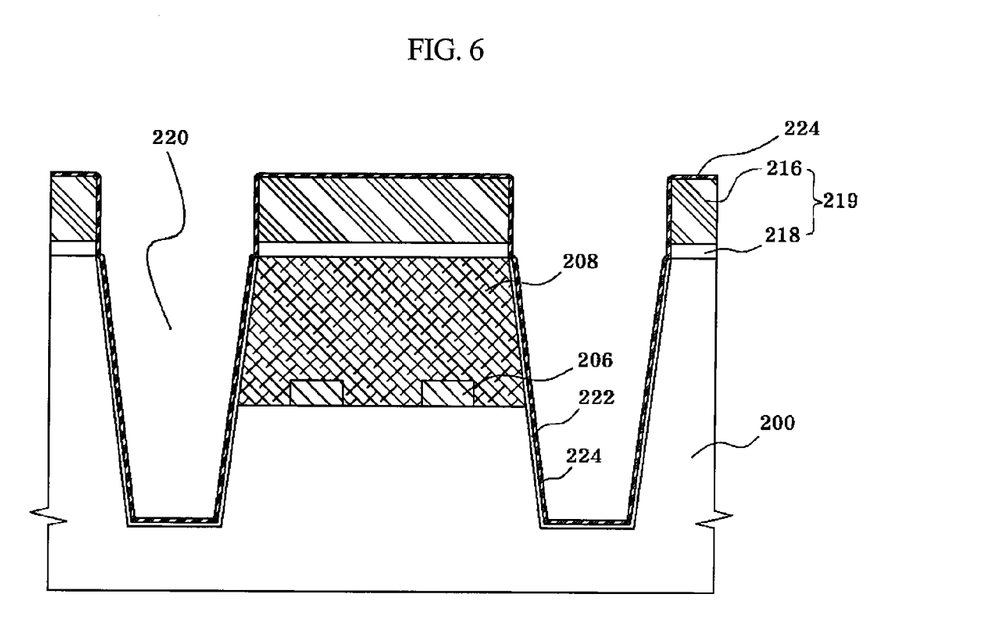

With reference to FIG. 6, a side wall oxide film 222 is formed in the first trenches 220. A liner nitride film 224 is formed on the side wall oxide film 222. The side wall oxide film 222 is formed using thermal oxidation. The liner nitride film 224 is formed in a furnace using low pressure chemical vapor deposition (LPCVD). The side wall oxide film 222 and the liner nitride film 224 prevent impurities from occurring between cells caused from doping during subsequent processes (e.g., boron (B) or phosphate (P)). If impurities occur between cells, leakage current will increase, thus the side wall oxide film 222 and the liner nitride film 224 improve the refresh characteristics of a DRAM.

Figure 7:
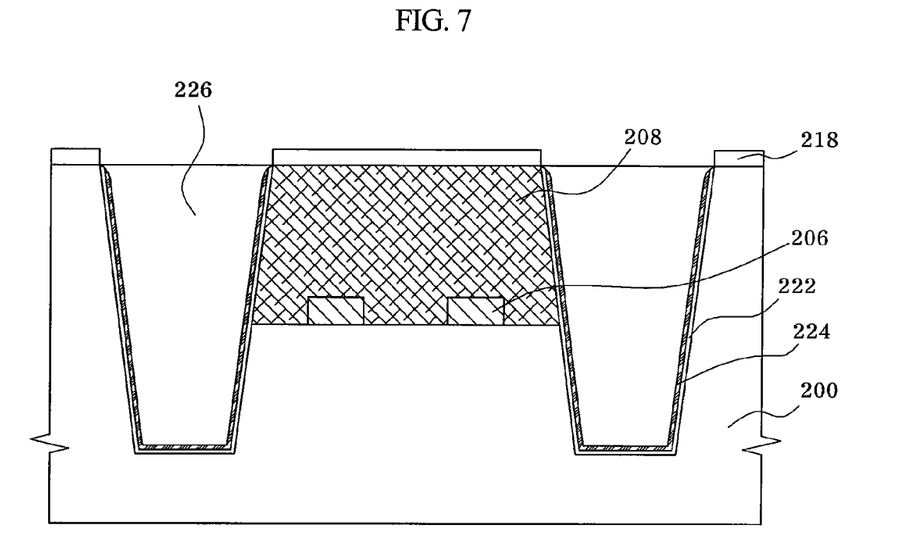

With reference to FIG. 7, a trench isolation film 226 which fills the first trenches 220 is formed on the semiconductor substrate 200. To fill the first trenches 220, the semiconductor substrate 200 is loaded into a high density plasma (HDP) chamber. Silane ($SiH_4$) gas serving as the source gas and at least one other gas serving as the additive gas (e.g., oxygen ($O_2$) gas, helium (He) gas, and/or hydrogen ($H_2$) gas), are supplied to the HDP chamber. Source power is applied to the HDP chamber to form plasma in the HDP chamber. Then, bias power is applied to the lower portion of the HDP chamber. Thereby, an oxide film, for example, a high density plasma oxide film, is formed on the semiconductor substrate 200.

A chemical mechanical polishing (CMP) process is performed on the semiconductor substrate 200 so as to expose the pad nitride film pattern 216, and then the exposed pad nitride film pattern 216 is removed from the semiconductor substrate 200. Thereby, the trench isolation film 226 is formed. Here, the pad nitride film pattern 216 may be removed by wet washing using a washing solution that includes phosphoric acid ($H_3PO_4$).

Figure 8:
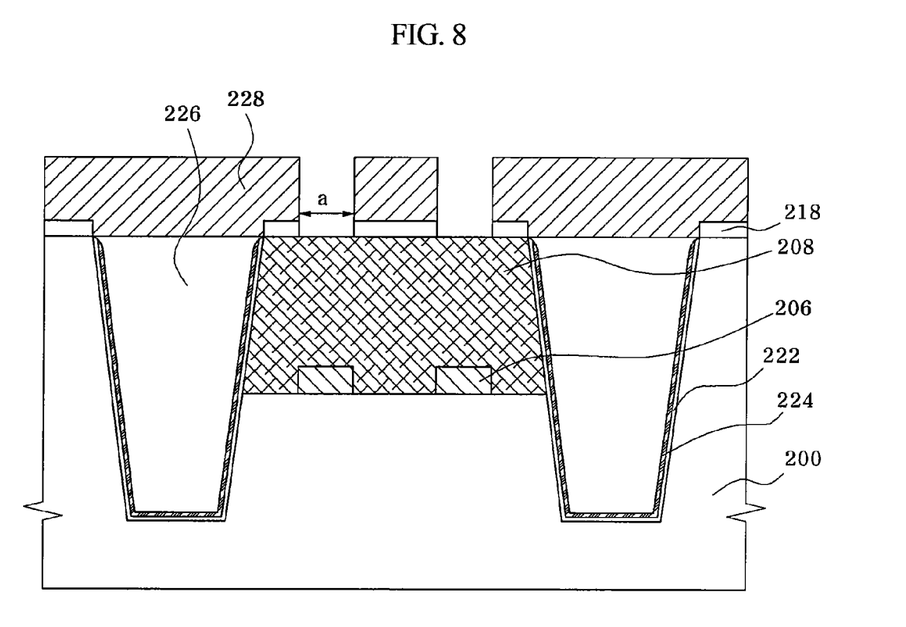

With reference to FIG. 8, a hard mask film is deposited on the semiconductor substrate 200. The hard mask film includes a polysilicon film. A photosensitive film is applied to the hard mask film, and is patterned, thus forming a photosensitive film pattern (not shown). The hard mask film is etched using the photosensitive pattern as a mask, thus forming a hard mask film pattern 228 which selectively exposes the pad oxide film pattern 218. That is, the hard mask film pattern 228 exposes the regions (a) where the trenches for recess gates will be formed. The hard mask film pattern 228 has a thickness of 500-1,500 Å. In order to minimize the misalignment of the etch stop film pattern 206 and the trenches for recess gates, the regions (a) in the hard mask film pattern 228 are aligned using the etch stop film pattern 206.

Figure 9:
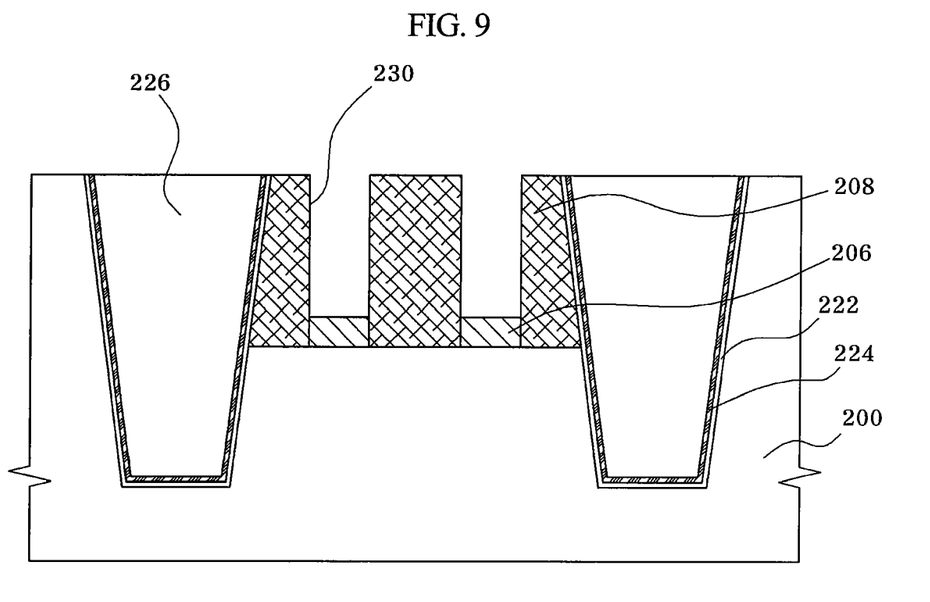

With reference to FIG. 9, the semiconductor layer 208 is etched using the hard mask film pattern 228 as a mask until the etch stop film pattern 206 is exposed. The etch stop film pattern 206 is disposed in the regions where the trenches for recess gates will be formed, and serves to prevent the semiconductor substrate 200 from being etched any further.

Figure 10:
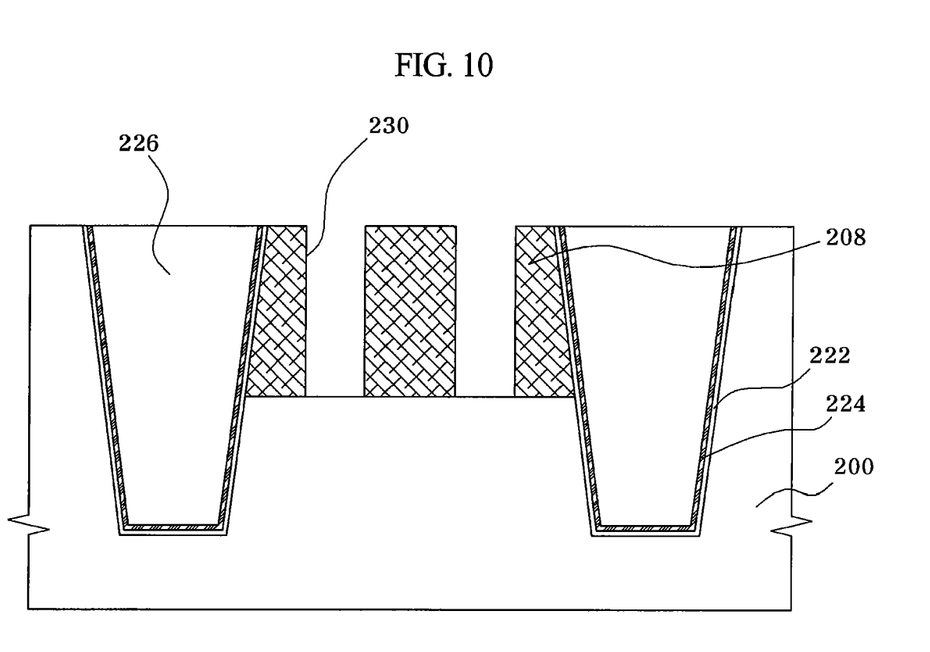

With reference to FIG. 10, the etch stop film pattern 206 is removed from the semiconductor substrate 200, thus forming second trenches 230 for recess gates. The etch stop film pattern 206 may be removed by wet washing using a washing solution that includes phosphoric acid ($H_3PO_4$). The second trenches 230 for recess gates have a depth of 1,000-1,500 Å.

In the conventional method, the trenches for recess gates have different depths due to varying process conditions when forming the trenches for recess gates. However, in the method of the present invention, the etch stop film pattern 206 prevents the semiconductor substrate 200 from being excessively etched, which allows the second trenches 230 for recess gates to have a predetermined and uniform depth throughout the semiconductor substrate 200. Thereby, the threshold voltages of the cell regions is uniformly distributed, and electrical characteristics of the semiconductor device is improved.

Further, in the conventional method, corners of the second trenches for recess gates may have a sharp profile. Combined with a gate dielectric film with a small thickness, which is deposited on the corners, an electric field is concentrated on the corners of the second trenches for recess gates. When the electric field is concentrated on the corners of the second trenches for recess gates, the breakdown voltage (BV) of the gate dielectric film is decreased, which causes the deterioration of refresh characteristics. Thereby degrading the characteristics of the semiconductor device.

Figure 11:
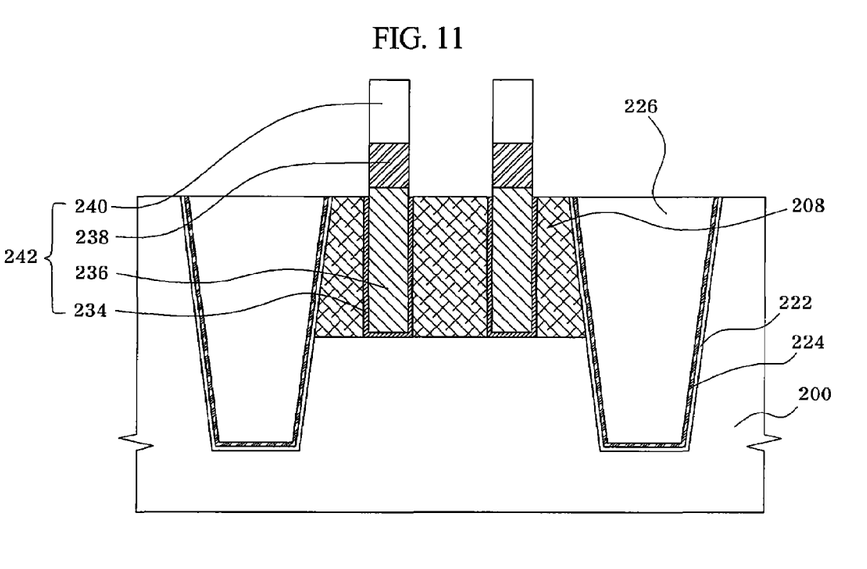

With reference to FIG. 11, the semiconductor substrate 200 including the second trenches 230 for recess gates is cleaned, and the remaining oxide film is removed. Then, the gate stack 242 is formed in each of the second trenches 230 for recess gates. The gate stack 242 includes a gate dielectric film pattern 234, a gate semiconductor layer pattern 236, a metal film pattern 238, and a hard mask film pattern 240.

As apparent from the above description, embodiments of the present invention provide a method for manufacturing a semiconductor device having recess gates, in which the depth of trenches for recess gates is predetermined using an etch stop film pattern, thus allowing the trenches for recess gates to have a uniform depth throughout a wafer. As a result, it is possible to prevent the nonuniform distribution of threshold voltage throughout the cell regions.

The embodiment of the present invention has been disclosed for illustrative purposes. Those skilled in the art will appreciate that various modifications, additions and substitutions are possible, without departing from the scope and spirit of the invention as disclosed in the accompanying claims.

What is claimed is:

1. A method for manufacturing a semiconductor device having recess gates, the method comprising:
   providing an etch stop pattern over a semiconductor substrate;
   forming a semiconductor layer over the semiconductor substrate and the etch stop pattern;
   forming first and second hard mask patterns defining an opening, the edges of the opening being vertically aligned to the edges of the etch stop pattern;
   etching the semiconductor layer using the first and second hard mask patterns until the etch stop pattern is exposed;
   removing the etch stop pattern to form a gate trench; and
   providing conductive material within the gate trench to form a recess gate.

2. The method according to claim 1, further comprising:
   forming a mask pattern over the semiconductor layer;
   forming first and second isolation trenches in the semiconductor substrate using the mask pattern; and
   filling the first and second isolation trenches with dielectric material to form first and second isolation structures,
   wherein the recess gate is provided between the first and second isolation structures.

3. The method according to claim 2, wherein the mask pattern includes a pad oxide film and a pad nitride film.

4. The method according to claim 1, wherein the etch stop pattern has a thickness of 30~300Å.

5. The method according to claim 1, wherein the etch stop pattern has a thickness of at least 100Å.

6. The method according to claim 1, wherein the etch stop pattern has a thickness of at least 200Å.

7. The method according to claim 1, wherein the etch stop pattern has a thickness of at least 300Å.

8. The method according to claim 1, wherein the etch stop pattern has a thickness of no more than 400Å.

9. The method according to claim 1, wherein the semiconductor layer includes silicon.

10. The method according to claim 9, wherein the silicon is polysilicon.

11. The method according to claim 9, wherein the silicon is amorphous silicon.

12. The method according to claim 1, wherein the semiconductor layer has a thickness of 1,000~1,500Å.

13. The method according to claim 1, wherein the first and second hard mask patterns include polysilicon.

14. The method according to claim 1, wherein each of the first and second hard mask patterns has a thickness of 500~1,500Å.

15. The method according to claim 1, wherein the gate trench has a thickness of 1,000~1,500Å.

16. The method according to claim 1, wherein the etch stop pattern includes a nitride film, and is removed from the semiconductor substrate by wet cleaning using a solution including phosphoric acid ($H_3PO_4$).

17. A method for manufacturing a semiconductor device having recess gates, the method comprising:

provi­ding an etch stop layer over a semiconductor substrate, the etch stop layer being at least 30Å;

forming a semiconductor layer over the semiconductor substrate and the etch stop layer;

forming first and second hard mask patterns defining an opening, wherein the edges of the opening are vertically aligned with the edges of the etch stop layer;

etching the semiconductor layer using the opening defined by the first and second hard mask patterns until the etch stop layer is exposed;

removing the exposed etch stop layer to form a gate trench; and providing conductive material within the gate trench to form a recess gate.

18. The method of claim 17, wherein the etch stop layer is at least 50Å.

19. The method of claim 17, wherein the etch stop layer is at least 100Å.

20. The method according to claim 17, wherein the gate trench has a thickness of at least 1,000Å.

* * * * *